(12) United States Patent
Tsai et al.

(10) Patent No.: US 11,877,447 B2
(45) Date of Patent: Jan. 16, 2024

(54) MANUFACTURING METHOD OF SEMICONDUCTOR STRUCTURE AND FLASH MEMORY

(71) Applicant: Winbond Electronics Corp., Taichung (TW)

(72) Inventors: Yao-Ting Tsai, Taichung (TW); Hsiu-Han Liao, Taichung (TW); Che-Fu Chuang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 18/297,659

(22) Filed: Apr. 10, 2023

(65) Prior Publication Data

US 2023/0255026 A1 Aug. 10, 2023

Related U.S. Application Data

(62) Division of application No. 17/376,079, filed on Jul. 14, 2021, now Pat. No. 11,678,484.

(30) Foreign Application Priority Data

Jul. 28, 2020 (TW) .................................. 109125446

(51) Int. Cl.
| | |
|---|---|
| *H01L 21/00* | (2006.01) |
| *H10B 41/42* | (2023.01) |
| *H01L 29/66* | (2006.01) |
| *H01L 29/788* | (2006.01) |
| *H10B 41/30* | (2023.01) |

(52) U.S. Cl.
CPC ....... *H10B 41/42* (2023.02); *H01L 29/66825* (2013.01); *H01L 29/7883* (2013.01); *H10B 41/30* (2023.02)

(58) Field of Classification Search
CPC ... H10B 41/42; H10B 41/30; H01L 29/66825; H01L 29/7883
See application file for complete search history.

(56) References Cited

U.S. PATENT DOCUMENTS

| | | | |
|---|---|---|---|
| 9,905,569 B1* | 2/2018 | Kim | ................ H01L 21/32133 |
| 10,699,958 B2* | 6/2020 | Liu | ................ H01L 29/6653 |
| 2014/0070304 A1* | 3/2014 | Komiya | ............. H01L 21/7682 |
| | | | 257/326 |

* cited by examiner

*Primary Examiner* — Richard A Booth
(74) *Attorney, Agent, or Firm* — JCIPRNET

(57) ABSTRACT

Disposed are a semiconductor structure, a manufacturing method thereof and a flash memory. The semiconductor structure includes a substrate, first isolation structures, a gate structure and an oxide layer. The first isolation structures define a first active area in a peripheral region of the substrate. The oxide layer is disposed on the substrate in the first active area and covered by the first isolation structures. The oxide layer and the first isolation structures define an opening exposing the substrate. The gate structure is disposed on the substrate in the first active area and includes a gate dielectric layer disposed in the opening and a gate disposed on the gate dielectric layer. The oxide layer is located around the gate dielectric layer. The width of the bottom surface of the gate is less than that of the top surface of the first active area.

20 Claims, 10 Drawing Sheets

_US 11,877,447 B2_

MANUFACTURING METHOD OF SEMICONDUCTOR STRUCTURE AND FLASH MEMORY

CROSS-REFERENCE TO RELATED APPLICATION

This application is a divisional application of and claims the priority benefit of U.S. application Ser. No. 17/376,079, filed on Jul. 14, 2021, now allowed, which claims the priority benefit of Taiwan application serial no. 109125446, filed on Jul. 28, 2020. The entirety of each of the above-mentioned patent applications is hereby incorporated by reference herein and made a part of this specification.

BACKGROUND

Technical Field

The invention relates to a semiconductor structure and a manufacturing method thereof, in particular to a semiconductor structure having a gate dielectric layer in the peripheral region of a substrate, a manufacturing method thereof and a flash memory.

Description of Related Art

For the peripheral region of the substrate in a flash memory, when forming peripheral devices (such as logic devices), a gate dielectric layer is usually formed on the substrate in the active area, and then a gate is formed on the gate dielectric layer. However, the oxide layer disposed on the substrate in the active area must be removed before the gate dielectric layer is formed, so that an opening is defined by the isolation structure, wherein the width of the bottom surface of the opening is greater than the width of the top surface of the active area, and a part of the substrate is exposed by the opening. As a result, the gate dielectric layer subsequently formed in the opening has a thinner thickness at the edge of the active area, resulting in uneven thickness of the gate dielectric layer, which affects the device performance. Furthermore, since the thickness of the gate dielectric layer at the edge of the active area is thinner, the leakage current is easily occurred at the edge of the active area during the operation of the device.

SUMMARY

The present invention provides a semiconductor structure, a manufacturing method thereof and a flash memory, in which the gate dielectric layer in the peripheral region of the substrate may have a uniform thickness, thereby the occurrence of the leakage current may be avoided.

A semiconductor structure of the present invention includes a substrate having a peripheral region, a plurality of first isolation structures, an oxide layer and a gate structure. The plurality of first isolation structures defines a first active area in the peripheral region of the substrate. The oxide layer is disposed on the substrate in the first active area and covered by the plurality of first isolation structures, wherein an opening exposing a part of the substrate is defined by the oxide layer and the plurality of first isolation structures. The gate structure is disposed on the substrate in the first active area and includes a gate dielectric layer and a gate. The gate dielectric layer is disposed on the substrate in the opening, so that the oxide layer is located around the gate dielectric layer. The gate is disposed on the gate dielectric layer, wherein the width of the bottom surface of the gate is less than the width of the top surface of the first active area.

A manufacturing method of the semiconductor structure of the present invention includes the following steps. A plurality of first isolation structures is formed in a peripheral region of a substrate, so that a first active area is defined between the plurality of first isolation structures. An oxide layer is formed on the substrate in the first active area, wherein the oxide layer is covered by the plurality of first isolation structures, and the oxide layer and the plurality of first isolation structures define an opening exposing a part of the substrate. A gate structure is formed on the substrate in the first active area. The steps of forming the gate structure includes the following steps. A gate dielectric layer is formed on the substrate in the opening, so that the oxide layer is located around the gate dielectric layer. A gate is formed on the gate dielectric layer, wherein the width of the bottom surface of the gate is less than the width of the top surface of the first active area.

A flash memory of the present invention includes a substrate having a memory region and a peripheral region, a plurality of isolation structures, a memory structure and a gate structure. The plurality of isolation structures is disposed in the substrate and defines an active area. The memory structure is disposed on the substrate in the memory region. The memory structure includes a tunneling dielectric layer, a floating gate, conductive spacers, a control gate and an inter-gate dielectric layer. The tunneling dielectric layer is disposed on the substrate in the active area. The floating gate is disposed on the tunneling dielectric layer. The conductive spacers are disposed on the sidewalls of the floating gate. The control gate covers the floating gate and the conductive spacers. The inter-gate dielectric layer is disposed between the control gate and the floating gate and between the control gate and the conductive spacers. The gate structure is disposed on the substrate in the active area in the peripheral region, wherein the width of the bottom surface of the gate structure is less than the width of the top surface of the active area in the peripheral region.

Based on the above, in the peripheral region of the semiconductor structure of the present invention, an oxide layer is disposed at the edge of the active area, so that a gate dielectric layer subsequently formed in an opening defined by the oxide layer may have a uniform thickness, and thus the occurrence of the leakage current may be avoided. In addition, in a flash memory of the present invention, a conductive spacer is disposed on the sidewalls of a floating gate in a memory structure, so that the gate coupling rate of the memory structure may be improved. In addition, the width of the bottom surface of a gate structure in the peripheral region is less than the width of the top surface of the active area in the peripheral region, so that a gate dielectric layer in a gate structure may have a uniform thickness, and thus the occurrence of the leakage current may be avoided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
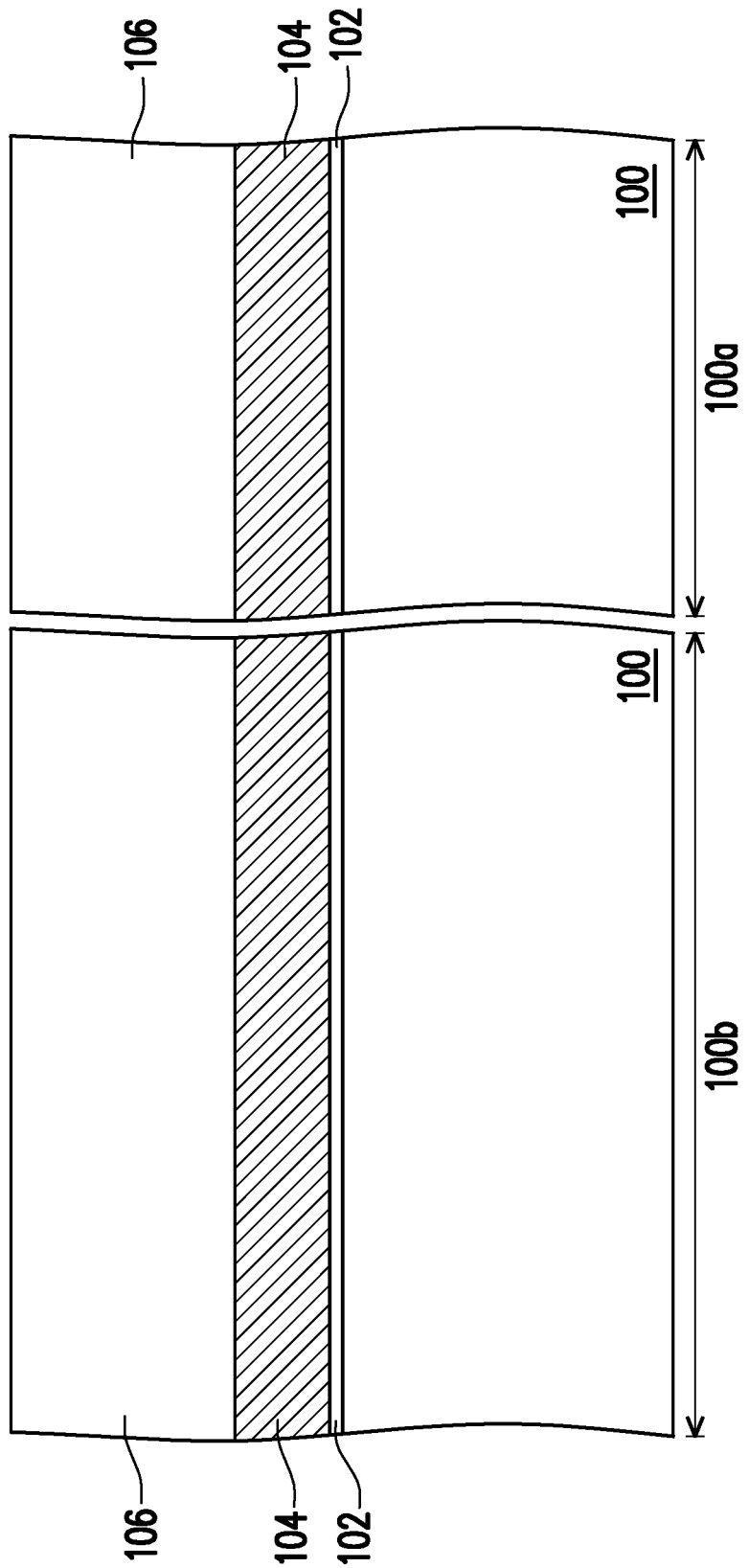
FIGS. 1A to 1J are schematic cross-sectional views of a manufacturing process of a semiconductor structure according to an embodiment of the invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

Referring to FIG. 1A, a substrate 100 is provided. The substrate 100 is, for example, a silicon substrate. The substrate 100 has a peripheral region 100a and a memory region 100b. The peripheral region 100a is an area where various peripheral devices (such as logic devices) may be formed, and the memory region 100b is an area where various memory structures (such as flash memory units) may be formed. Then, an oxide material layer 102, a first conductive layer 104 and a first mask layer 106 are sequentially formed on the substrate 100. In this embodiment, the first conductive layer 104 is, for example, a polysilicon layer, which is used to form a floating gate in a memory structure to be formed later. In addition, in this embodiment, the first mask layer 106 is, for example, a silicon oxide layer or a silicon nitride layer, but the invention is not limited thereto. In other embodiments, the first mask layer 106 may also be a composite mask layer composed of a silicon nitride layer and a silicon oxide layer.

Figure 1B:
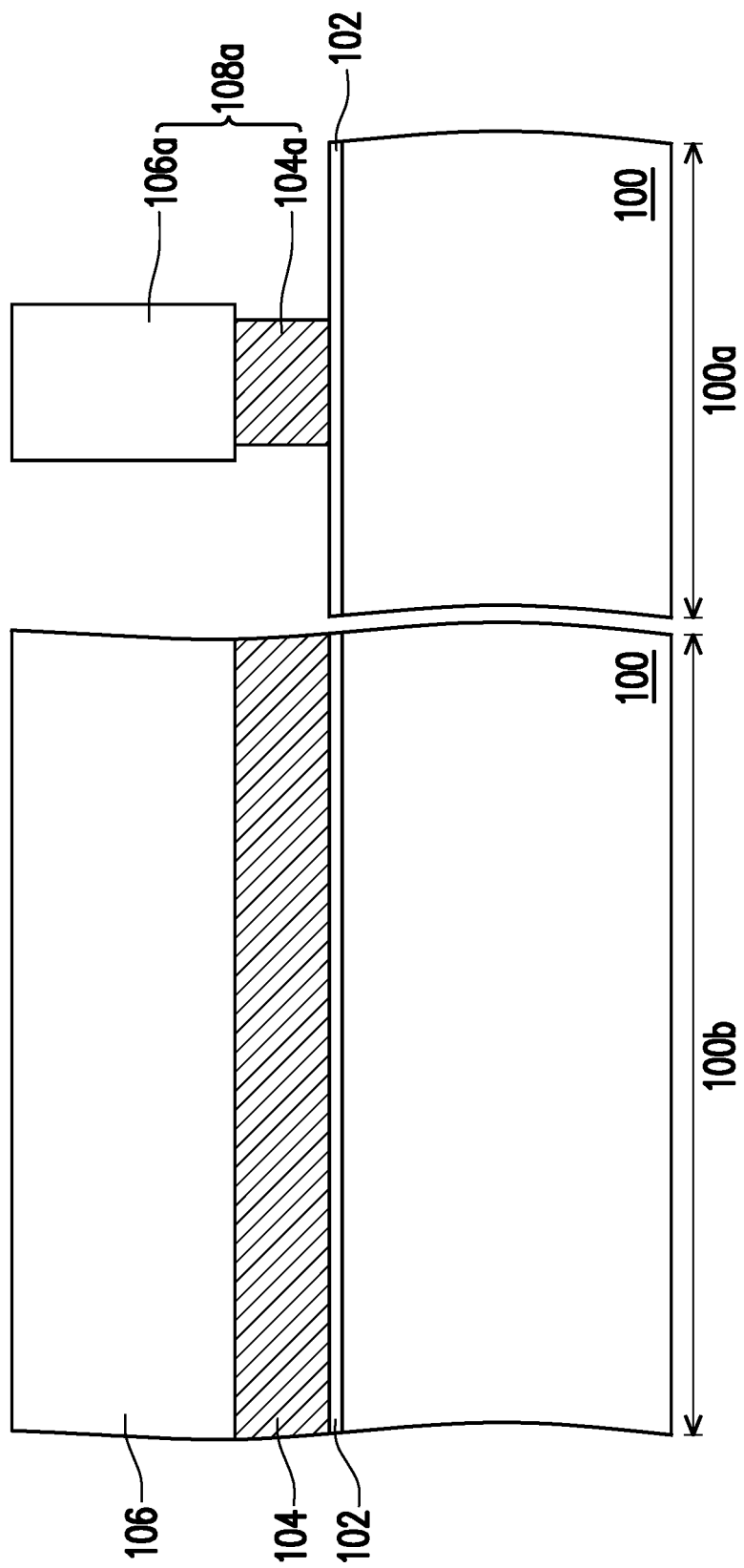

Referring to FIG. 1B, the first conductive layer 104 and the first mask layer 106 in the peripheral region 100a are patterned to form a first stack structure 108a on the oxide material layer 102 in the peripheral region 100a. In this embodiment, only one first stack structure 108a is drawn, but the present invention is not limited thereto. In detail, in this embodiment, a patterned photoresist layer (not shown) covering the memory region 100b and a part of the peripheral region 100a is formed on the first mask layer 106, and then an anisotropic etching process (such as a reactive ion etching (RIE) process) is performed to remove a part of the first conductive layer 104 and a part of the first mask layer 106 in the peripheral region 100a, so that the first patterned conductive layer 104a and the first patterned mask layer 106a are formed in the peripheral region 100a. After that, the patterned photoresist layer is removed. The method of patterning the first conductive layer 104 and the first mask layer 106 in the peripheral region 100a is well known to those skilled in the art, and the present invention is not limited thereto. The first patterned conductive layer 104a and the first patterned mask layer 106a constitute a first stack structure 108a. Then, the first patterned conductive layer 104a in the first stack structure 108a is partially removed, so that the width of the first patterned conductive layer 104a is less than the width of the first patterned mask layer 106a. In this embodiment, the method for partially removing the first patterned conductive layer 104a is, for example, a dry etching process.

Figure 1C:
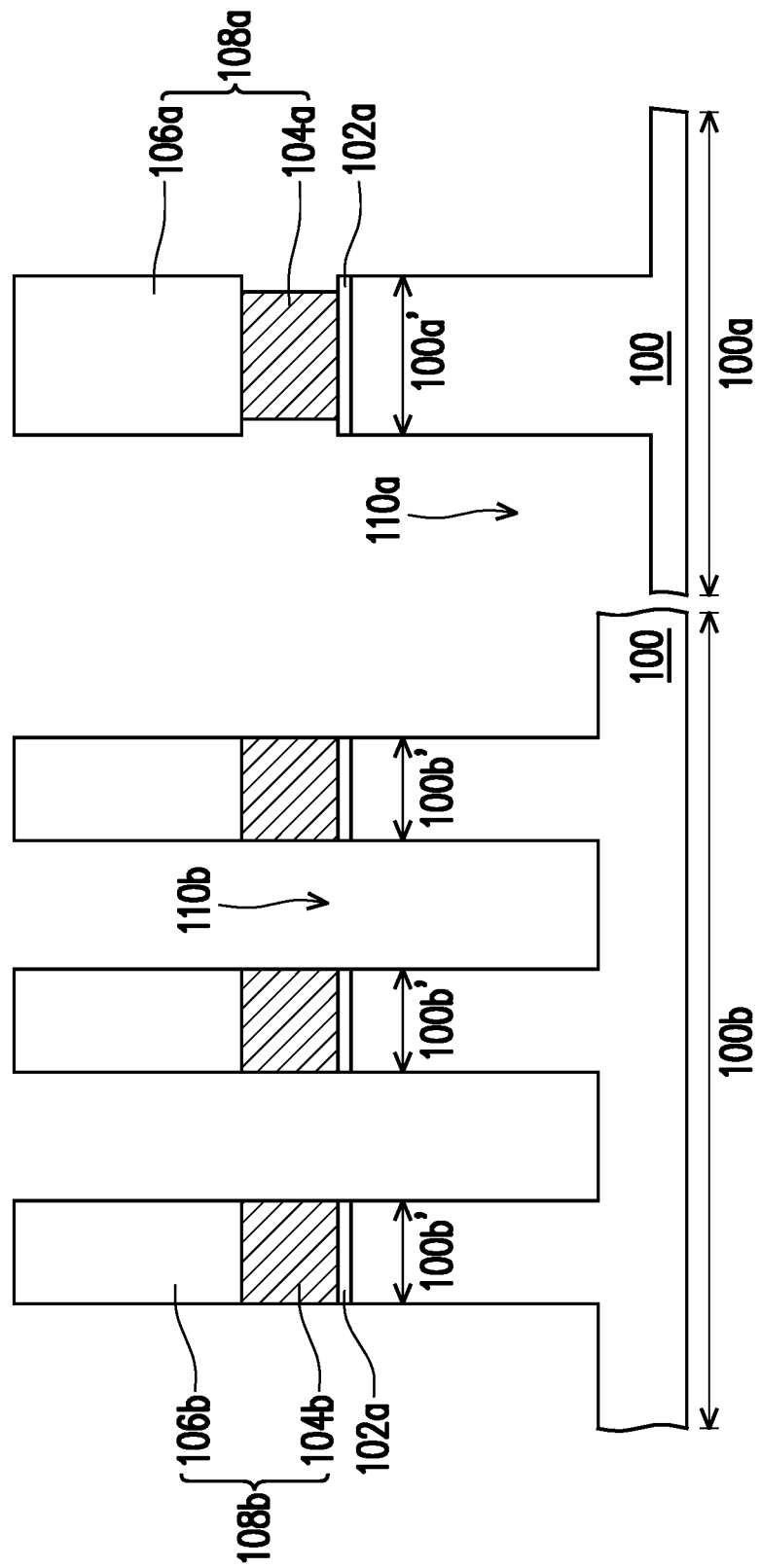

Referring to FIG. 1C, the first conductive layer 104 and the first mask layer 106 in the memory region 100b are patterned to form second stack structures 108b on the oxide material layer 102 in the memory region 100b. In this embodiment, only three second stack structures 108b are drawn, but the present invention is not limited thereto. In detail, in this embodiment, a patterned mask layer (not shown) covering the peripheral region 100a and a part of the memory region 100b is formed, and then an anisotropic etching process (such as a reactive ion etching process) is performed to remove a part of the first conductive layer 104 and a part of the first mask layer 106 in the memory region 100b, so that a second patterned conductive layer 104b and a second patterned mask layer 106b are formed in the memory region 100b. After that, the patterned mask layer is removed. The method of patterning the first conductive layer 104 and the first mask layer 106 in the memory region 100b is well known to those skilled in the art, and the present invention is not limited thereto. The second patterned conductive layer 104b and the second patterned mask layer 106b constitute second stack structures 108b.

Afterwards, using the first stack structure 108a and the second stack structures 108b as a mask, an anisotropic etching process (such as a reactive ion etching process) is performed to partially remove the oxide material layer 102 and the substrate 100, so that first trenches 110a are formed in the peripheral region 100a and second trenches 110b are formed in the memory region 100b. In the peripheral region 100a, a first active area 100a' is defined between the first trenches 110a, and in the memory region 100b, second active areas 100b' are defined between the second trenches 110b. In addition, the oxide material layer 102 remaining on the substrate 100 in the first active area 100a' and the second active areas 100b' is formed as an oxide layer 102a. At this time, the sidewalls of the oxide layer 102a in the peripheral region 100a are aligned with the boundary of the top surface of the first active area 100a', and the sidewalls of the oxide layer 102a in the memory region 100b are aligned with the boundary of the top surface of the second active areas 100b'. In addition, the oxide layer 102a and the second patterned conductive layer 104b in the second active areas 100b' may be respectively used as a tunneling dielectric layer and a floating gate in a memory structure formed later.

In this embodiment, since the device density in the memory region 100b is greater than the device density in the peripheral region 100a, the depth of the first trenches 110a is greater than the depth of the second trenches 110b after the anisotropic etching process is performed.

Figure 1D:
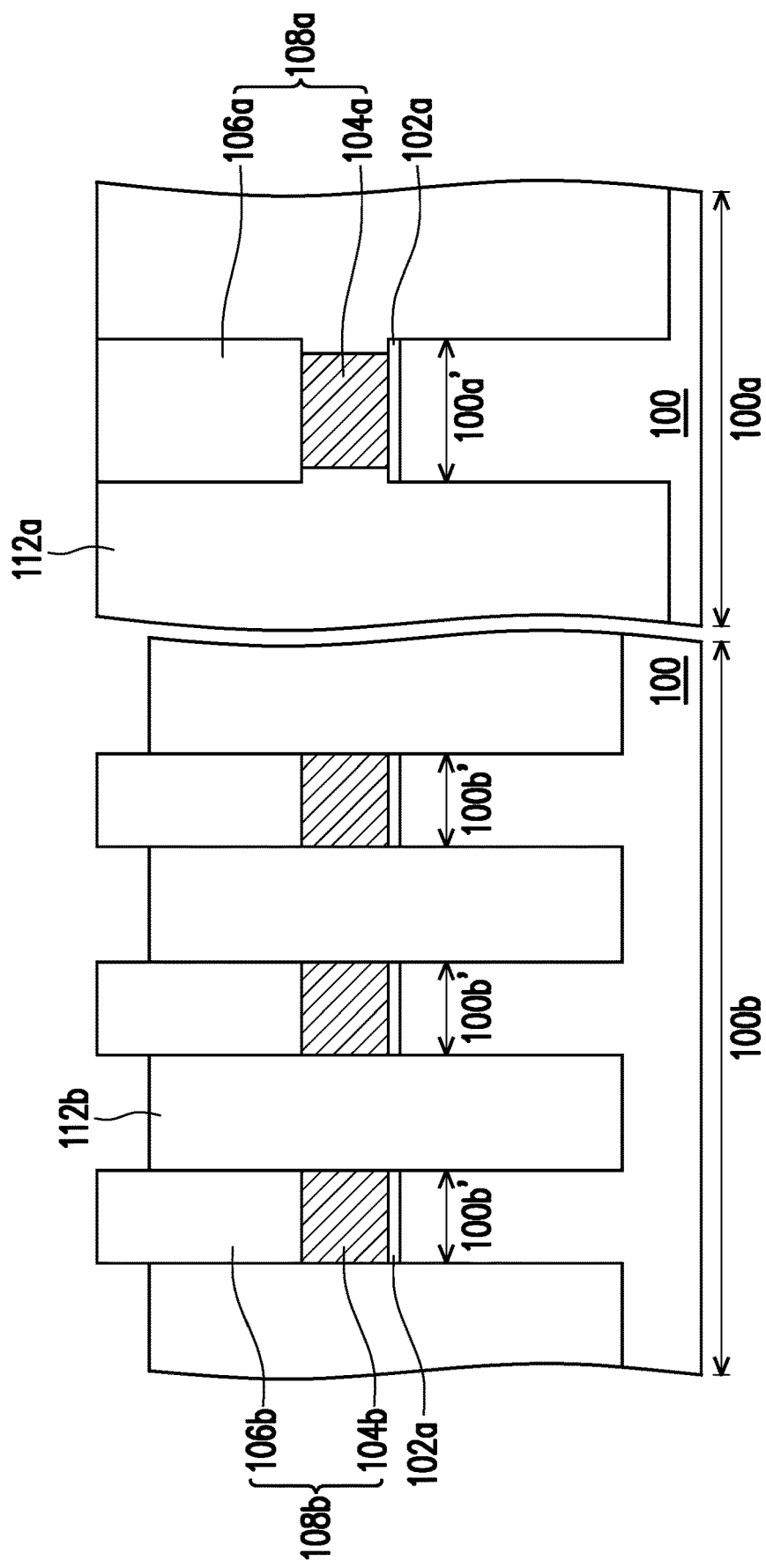

Referring to FIG. 1D, first isolation structures 112a are formed in the first trenches 110a and second isolation structures 112b are formed in the second trenches 110b. In the peripheral region 100a, the first isolation structures 112a cover a part of the surface of the oxide layer 102a. In detail, in this embodiment, after forming the first trench 110a and the second trenches 110b, an isolation material layer is formed on the substrate 100, and the isolation material layer covers the first stack structure 108a and the second tack structures 108b and fills the first trenches 110a and the second trenches 110b. The isolation material layer is, for example, a spin-on glass (SOG) layer. Then, a planarization process (such as a chemical mechanical polishing (CMP) process) is performed to remove a part of the isolation material layer until the top surface of the first stack structure 108a and the top surface of the second stack structures 108b are exposed. Then, a mask layer (for example, a photoresist layer) is formed to cover the peripheral region 100a. Then, using the mask layer and the second stack structures 108b as a mask, a dry etching process is performed to remove a part of the second isolation structures 112b, so that the top surface of the second isolation structures 112b is lower than the top surface of the first isolation structures 112a. After that, the mask layer is removed. Thereby, a recess is formed on each of the isolation structures 112b between the second stack structures 108b.

Figure 1E:
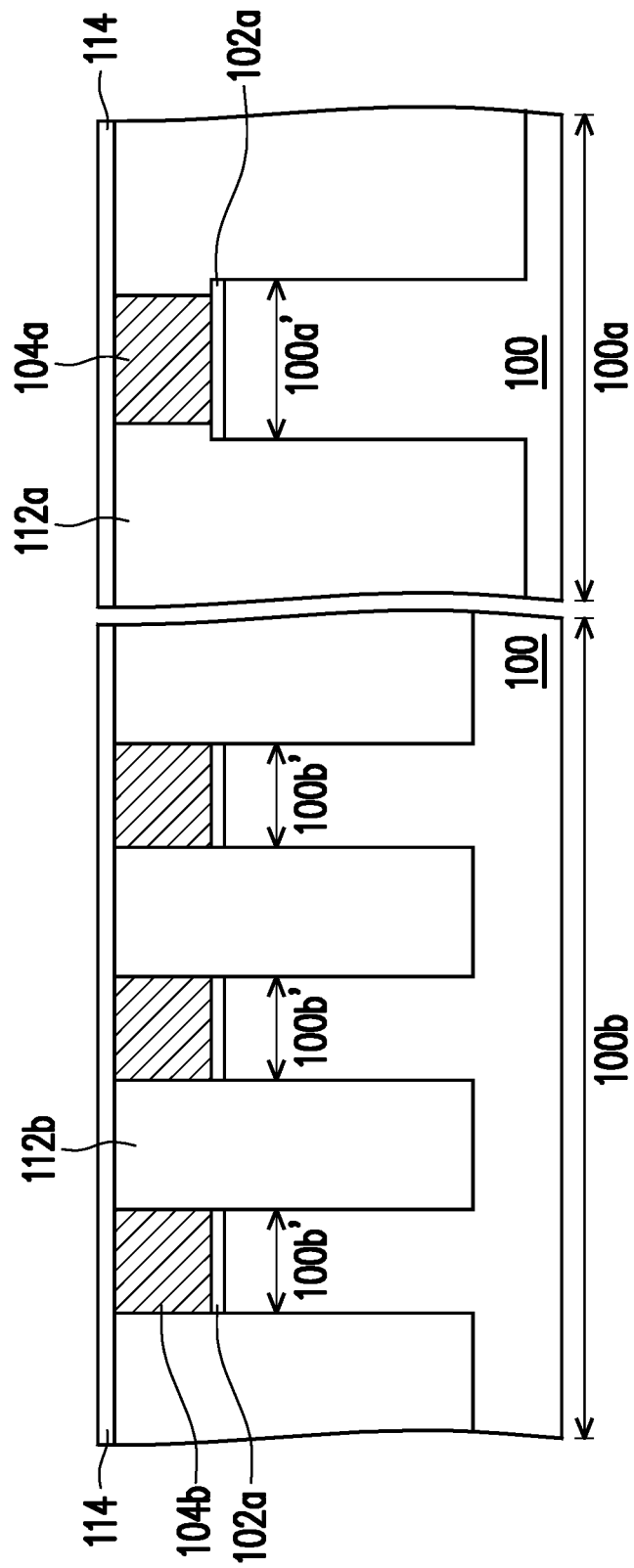

Referring to FIG. 1E, a blanket dry etching process is performed to remove a part of the first isolation structures 112a and a part of the second isolation structures 112b, so that the top surface of the first isolation structures 112a and the top surface of the second isolation structures 112b are lowered to the same level and not lower than the top surface of the second patterned conductive layer 104b. In this embodiment, the top surface of the first isolation structures 112a and the top surface of the second isolation structures 112b are lowered to be coplanar with the top surface of the second patterned conductive layer 104b.

In particular, in this embodiment, although the device density in the memory region 100b is different from the device density in the peripheral region 100a and it may affect the etching rates in the two regions, since the top surface of the second isolation structures 112b is appropriately lower than the top surface of the first isolation structures 112a in the step described in FIG. 1D, it becomes easy to control the top surface of the first isolation structures 112a and the top surface of the second isolation structures 112b to the same level after the dry etching process described in FIG. 1E.

After that, the first patterned mask layer 106a and the second patterned mask layer 106b are removed. Then, a protective layer 114 is formed on the first stack structure 108a, the second stack structures 108b, the first isolation structures 112a and the second isolation structures 112b. In this embodiment, the protective layer 114 is, for example, a nitride layer, but the invention is not limited to this. In other embodiments, the protective layer 114 may also be a composite layer composed of an oxide layer and a nitride layer.

Figure 1F:
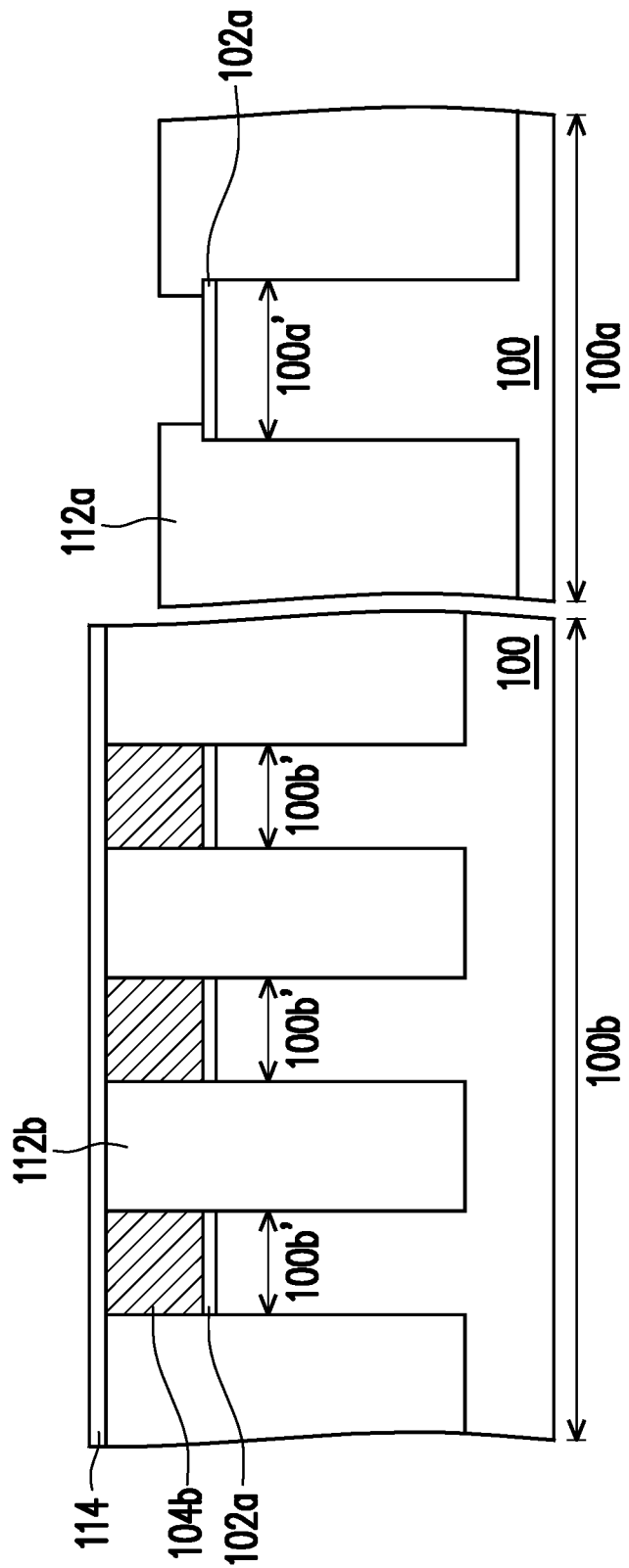

Referring to FIG. 1F, a mask layer (such as a photoresist layer) is formed to cover the memory region 100b. Then, using the mask layer as a mask, an anisotropic etching process (such as a reactive ion etching process) is performed to remove the protective layer 114 in the peripheral region 100a. After that, the mask layer is removed. Then, the first patterned conductive layer 104a is removed to expose a part of the oxide layer 102a. After the oxide layer 102a is partially exposed, an ion implantation process may be performed to implant dopants into the substrate 100 in the peripheral region 100a for adjusting the conductivity type of the substrate 100 in the first active area 100a'. After that, a part of the first isolation structures 112a in the peripheral region 100a may be removed to lower the height of the top surface of the first isolation structures 112a, but the present invention is not limited thereto. In this embodiment, since the protective layer 114 covers the memory region 100b, damage to the layers in the memory region 100b may be avoided during the first patterned conductive layer 104a and the part of the first isolation structures 112a are removed.

Figure 1G:
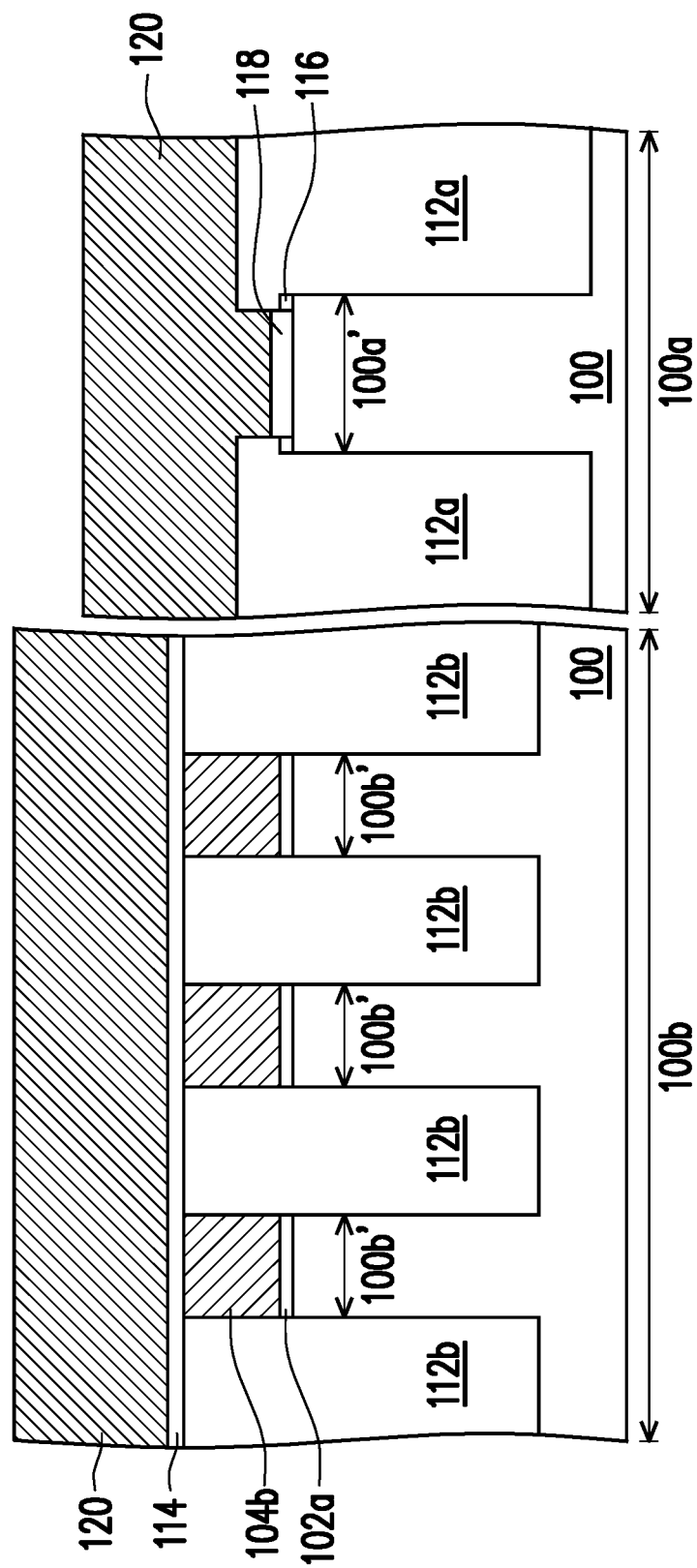

Referring to FIG. 1G, the oxide layer 102a that is not covered by the first isolation structures 112a in the peripheral region 100a is removed to expose a part of the substrate 100. At this time, the remaining oxide layer 102a is located at the edge of the first active area 100a' to form the oxide layer 116, and the oxide layer 116 is covered by the first isolation structures 112a. Next, a dielectric layer 118 is formed on the substrate 100 exposed by the first isolation structures 112a in the peripheral region 100a. In this embodiment, the dielectric layer 118 is, for example, an oxide layer, which is used as a gate dielectric layer in a peripheral device (for example, a logic device) formed later. At this time, the oxide layer 116 is located around the dielectric layer 118. In addition, the thickness of the dielectric layer 118 may be greater than or equal to the thickness of the oxide layer 116, that is, the top surface of the oxide layer 116 is not higher than the top surface of the gate dielectric layer. After that, a gate material layer 120 is formed on the substrate 100. The gate material layer 120 covers the protective layer 114, the first isolation structures 112a and the dielectric layer 118. In this embodiment, the gate material layer 120 is, for example, a polysilicon layer, which is used as a gate in a peripheral device (for example, a logic device) formed later.

Figure 1H:
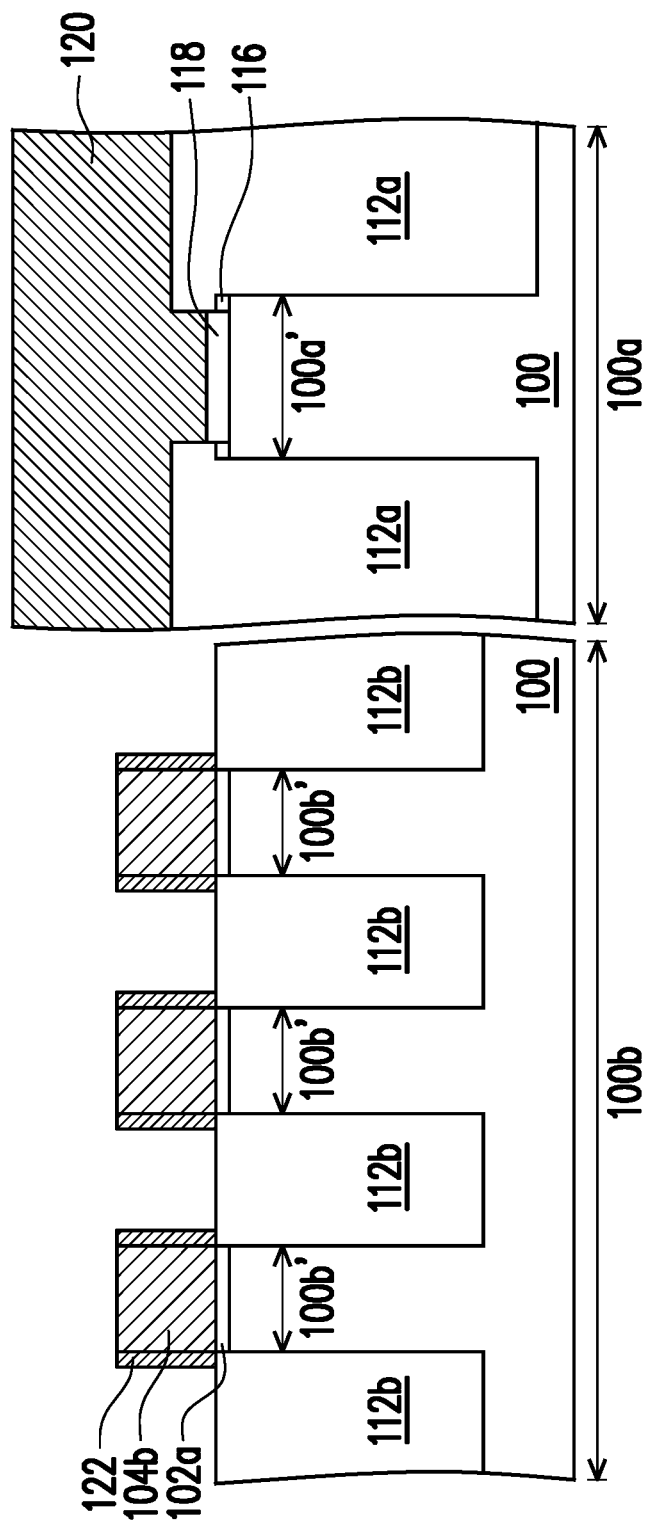

Referring to FIG. 1H, the gate material layer 120 in the memory region 100b is removed, and the gate material layer 120 in the peripheral region 100a is remained. Then, the protective layer 114 is removed to expose the second patterned conductive layer 104b and the second isolation structures 112b in the memory region 100b. Afterwards, an etching process is performed to remove a part of the second isolation structures 112b so as to be moderately lower than the top surface of the second patterned conductive layer 104b, but not lower than the top surface of the oxide layer 102a. In this embodiment, after removing the part of the second isolation structures 112b, the top surface of the second isolation structures 112b and the top surface of the oxide layer 102a are coplanar. In this way, the sidewalls of the second patterned conductive layer 104b may be exposed to the greatest extent, which is beneficial to increase the gate coupling rate of the subsequently formed memory structure.

After that, conductive spacers 122 are formed on the sidewalls of the second patterned conductive layer 104b. In this embodiment, the material of the conductive spacers 122 is, for example, polysilicon. The forming method of the conductive spacers 122 is, for example, to conformally form a spacer material layer on the substrate 100 and then perform an anisotropic etching process to partially remove the spacer material layer. At this time, the conductive spacers 122 are formed on the sidewalls of the second patterned conductive layer 104b, and the bottom surface of the conductive spacers 122 is not lower than the top surface of the oxide layer 102a.

In this embodiment, depending on the space between adjacent second patterned conductive layers 104b and the thickness of the inter-gate dielectric layer and the thickness of the control gate in the subsequently formed memory structure, the ratio of the width of the conductive spacer 122 (the thickness of the spacer material layer) to the width of the second patterned conductive layer 104b does not exceed 1:4.5. Preferably, the ratio of the width of the conductive spacer 122 to the width of the second patterned conductive layer 104b is between 1:9 and 1:4.5. For example, when the width of the second patterned conductive layer 104b is 45 nm, the width of the conductive spacer 122 does not exceed 10 nm, preferably between 5 nm and 10 nm. The conductive spacers 122 may be used to increase the size of the floating gate in the subsequently formed memory structure for increasing the gate coupling rate of the memory structure. In other words, the conductive spacers 122 and the second patterned conductive layer 104b may also be regarded as a floating gate in the memory structure as a whole.

Figure 1I:
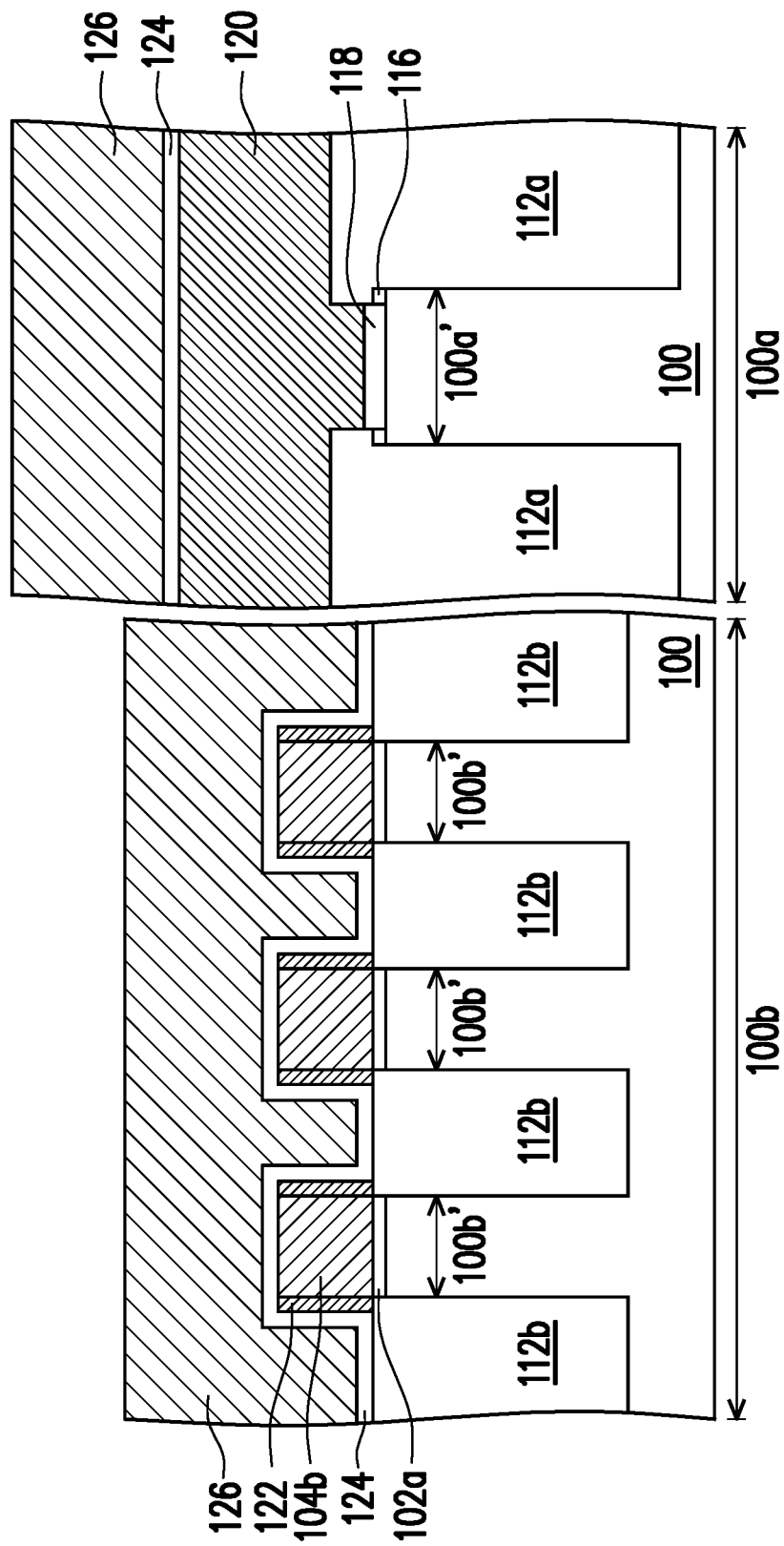

Referring to FIG. 1I, a dielectric layer 124 is formed to cover the second patterned conductive layer 104b and the conductive spacers 122. In this embodiment, the dielectric layer 124 is conformally formed on the substrate 100. In addition, in this embodiment, the dielectric layer 124 is, for example, an oxide layer, but the invention is not limited thereto. In other embodiments, the dielectric layer 124 may also be a composite dielectric layer composed of a silicon oxide layer, a silicon nitride layer and a silicon oxide layer, which is also known as an ONO composite dielectric layer. Then, a second conductive layer 126 is formed on the dielectric layer 124. In this embodiment, the second conductive layer 126 is, for example, a polysilicon layer, which is used to form the control gate in the memory structure formed later.

Figure 1J:
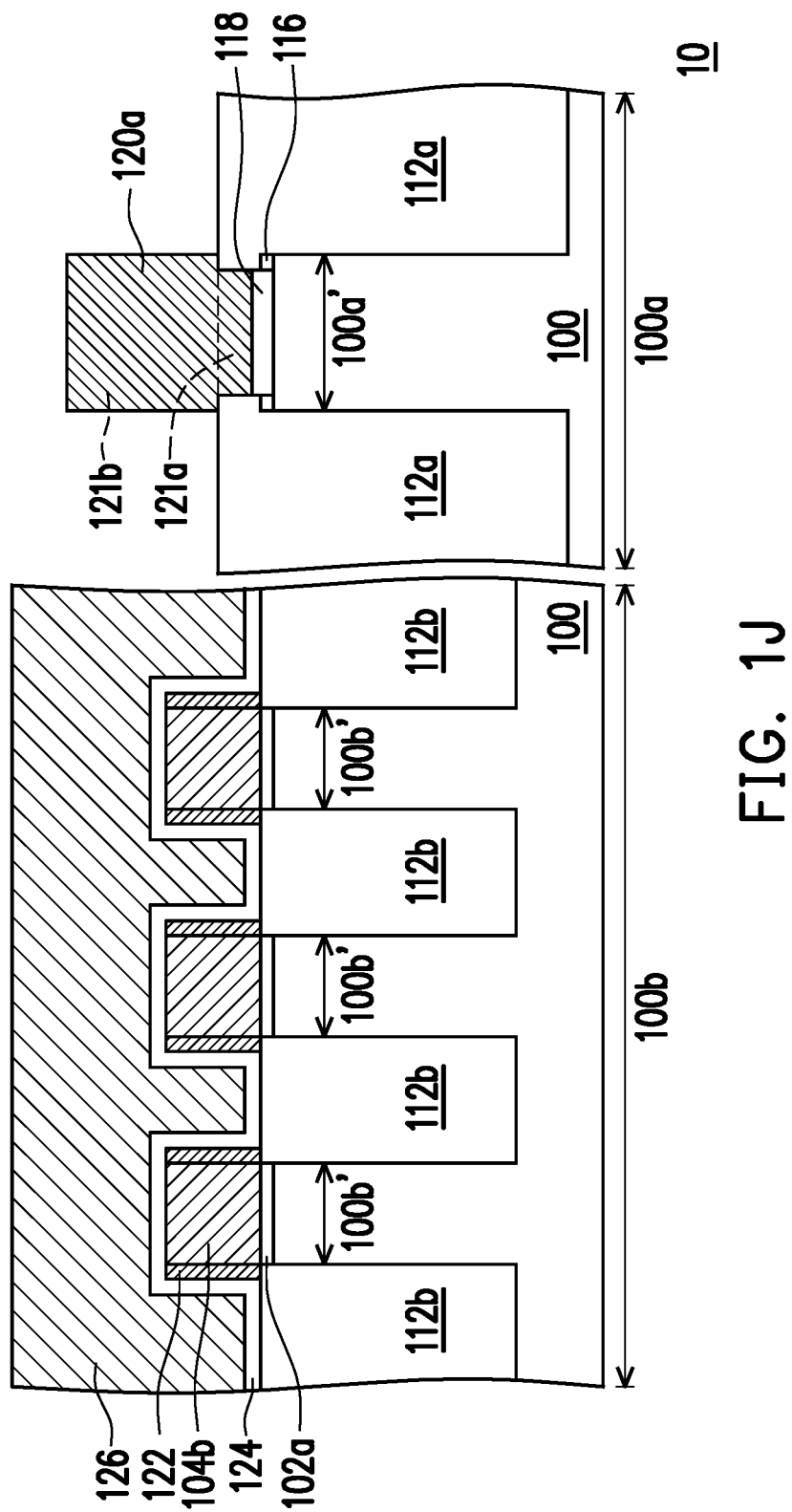

Referring to FIG. 1J, the second conductive layer 126 and the dielectric layer 124 in the peripheral region 100a are removed to expose the gate material layer 120. At this time, the second conductive layer 126 remained in the memory region 100b serves as the control gate in the memory structure. Then, the gate material layer 120 in the peripheral region 100a is patterned to form the gate 120a. The gate 120a includes a first portion 121a on the dielectric layer 118 and a second portion 121b on the first portion 121a, and the width of the first portion 121a is less than the width of the second portion 121b. In other words, in this embodiment, the width of the bottom surface of the gate 120a is less than the width of the top surface of the first active area 100a'. In this way, the semiconductor structure 10 of this embodiment is completed.

In the semiconductor structure 10 of this embodiment, since conductive spacers 122 are disposed on the sidewalls of the floating gate (the second patterned conductive layer 104b) in the memory structure, when the device size is gradually reduced, the memory structure may still have enough gate coupling rate to avoid performance degradation of memory structure.

In addition, for the peripheral devices in the peripheral region 100a, since the oxide layer 102a is disposed at the edge of the first active area 100a', the gate dielectric layer (the dielectric layer 118) subsequently formed in the opening defined by the oxide layer 102a may have a uniform thickness. As a result, the problem that the thickness of the gate dielectric layer in the peripheral region is thinner at the edge of the active area in the art is solved, and therefore the occurrence of the leakage current may be effectively avoided.

It will be apparent to those skilled in the art that various modifications and variations can be made to the disclosed embodiments without departing from the scope or spirit of the disclosure. In view of the foregoing, it is intended that the disclosure covers modifications and variations disposed that they fall within the scope of the following claims and their equivalents.

What is claimed is:

1. A manufacturing method of a semiconductor structure, comprising:
    providing a substrate having a peripheral region and a memory region;
    forming a plurality of first isolation structures in the substrate in the peripheral region, so that a first active area is defined between the first isolation structures;
    forming an oxide layer on the substrate in the first active area, wherein a top surface of the oxide layer is covered by the first isolation structures, and an opening is defined in the oxide layer and the first isolation structures covering the oxide layer and exposes a part of the substrate; and
    forming a gate structure on the substrate in the first active area, wherein steps of forming the gate structure comprises:
        forming a gate dielectric layer on the substrate in the opening, so that the oxide layer is located around the gate dielectric layer; and
        forming a gate on the gate dielectric layer, wherein a width of a bottom surface of the gate is less than a width of a top surface of the first active area.

2. The manufacturing method of claim 1, wherein the gate has a first portion and a second portion, the first portion is located on the gate dielectric layer, the second portion is located on the first portion, and a width of the first portion is less than a width of the second portion.

3. The manufacturing method of claim 1, further comprising:
    forming a plurality of second isolation structures in the substrate in the memory region, so that a second active area is defined between the second isolation structures, and a depth of each of the second isolation structures is less than a depth of each of the first isolation structures; and
    forming a memory structure on the substrate in the memory region, wherein the memory structure comprises a tunneling dielectric layer and a floating gate formed on the tunneling dielectric layer.

4. The manufacturing method of claim 3, wherein a forming method of the first isolation structures, the second isolation structures, the oxide layer and the memory structure comprises:
    forming an oxide material layer, a first conductive layer and a first mask layer in sequence on the substrate;
    patterning the first conductive layer and the first mask layer in the peripheral region to form a first patterned conductive layer and a first patterned mask layer in the peripheral region, wherein the first patterned conductive layer and the first patterned mask layer constitute a first stack structure;
    partially removing the first patterned conductive layer in the first stack structure;
    patterning the first conductive layer and the first mask layer in the memory region to form a second patterned conductive layer and a second patterned mask layer in the memory region, wherein the second patterned conductive layer and the second patterned mask layer constitute a second stack structure;
    partially removing the oxide material layer and the substrate using the first stack structure and the second stack structure as masks to form first trenches in the peripheral region and second trenches in the memory region, and to form the tunneling dielectric layer and the floating gate of the memory structure;
    forming the first isolation structures in the first trenches and forming the second isolation structures in the second trenches, wherein the first isolation structures cover a part of the oxide material layer;
    removing the first patterned mask layer and the second patterned mask layer;
    removing the first patterned conductive layer; and
    removing the oxide material layer not covered by the first isolation structures to form the oxide layer.

5. The manufacturing method of claim 4, wherein a forming method of the memory structure further comprises:
    forming conductive spacers on sidewalls of the second patterned conductive layer after forming a gate material layer in the peripheral region;
    forming a dielectric layer to cover the second patterned conductive layer and the conductive spacers; and
    forming a second conductive layer on the dielectric layer.

6. The manufacturing method of claim 5, wherein a bottom surface of the conductive spacers is not lower than a top surface of the tunneling dielectric layer.

7. The manufacturing method of claim 5, wherein a ratio of a width of the conductive spacers to a width of the floating gate does not exceed 1:4.5.

8. The manufacturing method of claim 1, wherein the top surface of the oxide layer is not higher than a top surface of the gate dielectric layer.

9. The manufacturing method of claim 1, wherein outer sidewalls of the oxide layer are aligned with a boundary of the top surface of the first active area.

10. The manufacturing method of claim 2, wherein a part of the first isolation structures extends to be located between the oxide layer and the second portion of the gate.

11. The manufacturing method of claim 2, wherein sidewalls of the first portion are aligned with sidewalls of the gate dielectric layer.

12. A manufacturing method of a flash memory, comprising:
providing a substrate having a memory region and a peripheral region;
forming a plurality of first isolation structures in the substrate in the peripheral region to define a first active area between the first isolation structures;
forming a memory structure on the substrate in the memory region, wherein the memory structure comprises:
a tunneling dielectric layer, disposed on the substrate in a second active area in the memory region;
a floating gate, located on the tunneling dielectric layer;
conductive spacers, located on sidewalls of the floating gate;
a control gate, covering the floating gate and the conductive spacers; and
an inter-gate dielectric layer, located between the control gate and the floating gate and between the control gate and the conductive spacers;
forming an oxide layer on the substrate in the first active area, wherein a top surface of the oxide layer is covered by the first isolation structures, and an opening is defined in the oxide layer and the first isolation structures covering the oxide layer and exposes a part of the substrate; and
forming a gate structure on the substrate in the first active area in the peripheral region, wherein a width of a bottom surface of the gate structure is less than a width of a top surface of the first active area in the peripheral region.

13. The manufacturing method of claim 12, wherein steps of forming the gate structure comprises:
forming a gate dielectric layer on the substrate in the opening, so that the oxide layer is located around the gate dielectric layer; and
forming a gate on the gate dielectric layer, wherein a width of a bottom surface of the gate is less than a width of a top surface of the first active area.

14. The manufacturing method of claim 13, wherein the gate has a first portion and a second portion, the first portion is located on the gate dielectric layer, the second portion is located on the first portion, and a width of the first portion is less than a width of the second portion.

15. The manufacturing method of claim 14, wherein sidewalls of the first portion are aligned with sidewalls of the gate dielectric layer.

16. The manufacturing method of claim 14, wherein a part of the first isolation structures extends to be located between the oxide layer and the second portion of the gate.

17. The manufacturing method of claim 13, wherein the top surface of the oxide layer is not higher than a top surface of the gate dielectric layer.

18. The manufacturing method of claim 12, further comprising forming a plurality of second isolation structures in the substrate in the memory region to define the second active area between the second isolation structures, wherein a depth of each of the second isolation structures is less than a depth of each of the first isolation structures.

19. The manufacturing method of claim 12, outer sidewalls of the oxide layer are aligned with a boundary of the top surface of the first active area.

20. The manufacturing method of claim 12, wherein a bottom surface of the conductive spacers is not lower than a top surface of the tunneling dielectric layer.

* * * * *